United States Patent [19]
Miyake

[11] Patent Number: 4,814,640
[45] Date of Patent: Mar. 21, 1989

[54] ELECTRICALLY TRIMMABLE SEMICONDUCTOR DEVICE

[75] Inventor: Shigeru Miyake, Suita, Japan

[73] Assignee: Ricoh Company, Ltd., Tokyo, Japan

[21] Appl. No.: 18,611

[22] Filed: Feb. 25, 1987

[30] Foreign Application Priority Data

Feb. 27, 1986 [JP] Japan .................................. 61-43373

[51] Int. Cl.⁴ .................. H03K 17/56; H03K 19/177; H03K 19/003; H03B 5/36
[52] U.S. Cl. .................................... 307/303; 307/242; 307/304; 307/482; 331/116 FE
[58] Field of Search ............... 307/303, 241, 242, 493, 307/304, 482, 490, 494, 495; 340/562, 347 DA; 331/116 FE

[56] References Cited

U.S. PATENT DOCUMENTS

| | | | |
|---|---|---|---|
| 3,652,960 | 3/1972 | Sakamoto et al. | 377/114 |
| 3,803,828 | 4/1974 | Keeler et al. | 331/116 FE |
| 4,016,483 | 4/1977 | Rudin | 307/303 |
| 4,179,671 | 12/1979 | Yoshida et al. | 307/304 |
| 4,216,451 | 8/1980 | Nishimura et al. | 307/303 |
| 4,308,467 | 12/1981 | Kolluri et al. | 307/304 |
| 4,424,456 | 1/1984 | Shizaki et al. | 377/60 |
| 4,449,118 | 5/1984 | Dingwall et al. | 307/450 |
| 4,532,607 | 7/1985 | Uchida | 307/269 |
| 4,639,615 | 1/1987 | Lee et al. | 307/269 |
| 4,707,620 | 1/1987 | Sullivan et al. | 307/270 |

Primary Examiner—Stanley D. Miller
Assistant Examiner—Tai V. Duong
Attorney, Agent, or Firm—Cooper & Dunham

[57] ABSTRACT

A trimmable semiconductor device includes a plurality of capacitors or resistors, each of which has a predetermined value, and a plurality of programmable switches each of which is operatively associated with the corresponding one of the plurality of capacitors or resistors. All of the capacitors or resistors and the programmable switches are fabricated internally and thus on the same chip or substrate. Thus, when the plurality of programmable switches are selectively programmed, the corresponding ones of the plurality of capacitors or resistors are selected and thus connected to a circuit formed on the substrate, thereby carrying out required adjustments electrically.

5 Claims, 2 Drawing Sheets

ELECTRICALLY TRIMMABLE SEMICONDUCTOR DEVICE

BACKGROUND OF THE INVENTION

1. Field of the Invention

This invention generally relates to a semiconductor device, and, in particular, to an electrically trimmable semiconductor device including at least one adjustable element, such as an adjustable capacitor or a variable resistor. More specifically, the present invention relates to a semiconductor device suitable for use as a clock I.C. or power supply I.C.

2. Description of the Prior Art

FIG. 1 schematically shows a prior art oscillating circuit for use in a typical clock I.C. As shown, an inverter 2 and a resistor 4 are provided in an I.C. as connected in parallel. Outside of the I.C. is provided a circuit including a quartz oscillator 6, a trimmer capacitor 8 and a capacitor 10 having a fixed capacitance, which is connected to the parallely connected inverter 2 and resistor 4 via a pair of terminals 28 and 29. In such an I.C. having an oscillating circuit incorporated therein, it is necessary to adjust the oscillating frequency one by one so as to obtain an accurate frequency. Such adjustment is typically carried out by operating the trimmer capacitor 8 provided outside of the body of I.C., for example, using a screw driver until the oscillating frequency reaches a desired value.

FIG. 2 shows a prior art constant power supply I.C., in which there is provided a bipolar transistor 12 which has its collector connected to an input terminal 13 and its emitter connected to an output terminal 15. The base of the bipolar transistor 12 is connected to an output terminal of a comparator 14 which has its non-inverting input terminal connected from the output terminal 15 through a resistor 16 and also from ground through a Zener diode 17. The comparator 14 has its inverting input terminal connected to a tap of a variable resistor 18 which is provided outside of the I.C. 19 and the variable resistor 18 has its one end connected to the output terminal 15 through a resistor and its other end connected to ground through another resistor. It is to be noted that the region 19 circumscribed by the one-dotted line corresponds to the interior of the I.C. In this constant power supply I.C., in order to obtain an accurate output voltage, the variable resistor 18 provided outside of the I.C. 19 is adjusted.

As described above, in the case of an I.C. requiring adjustments in capacitances and/or resistances, it is typical to provide an adjustable element, such as a trimmable capacitor or variable resistor, outside of the I.C. For this reason, the cost tends to be pushed up because of the necessity to provide an adjustable element outside of the I.C. Besides, the adjustment of such a trimmer capacitor or variable resistor must be carried out manually and mechanically by an operator for each I.C., which also tends to push up the cost. It is true that the adjustment can be carried out automatically using a laser trimming technology; however, a laser trimming apparatus is quite expensive and adjustment cannot be carried out after assembling, so that adjustment can be carried out only for a single I.C. and adjustment cannot be carried out by the user if an additional element is connected to the I.C.

SUMMARY OF THE INVENTION

In accordance with the principle of the present invention, there is provided a semiconductor device comprising a plurality of electrical elements, each having a predetermined electrical value, and programmable means operatively coupled to the plurality of electrical elements, whereby the programmable means is suitably programmed to select at least one of the plurality of electrical elements for use. Such an electrical element may be a capacitor or a resistor. For example, in one embodiment, capacitors may be connected in parallel between a first terminal and a second terminal and a plurality of switching elements are provided such that each of the switching elements is connected in series with the corresponding capacitor. Thus, when the switching elements are selectively turned on or off by programming, the plurality of capacitors are selectively connected between the first and second terminals in parallel. On the other hand, in another embodiment, resistors may be connected in series and the programmable means may be suitably programmed to establish a connection to at least desired one of junctions of the serially connected resistors.

It is therefore a primary object of the present invention to obviate the disadvantages of the prior art and to provide an improved trimmable semiconductor device.

Another object of the present invention is to provide an electrically trimmable semiconductor device compact in size and low at cost.

A further object of the present invention is to provide an internally trimmable semiconductor device capable of carrying out trimming accurately and easily.

Other objects, advantages and novel features of the present invention will become apparent from the following detailed description of the invention when considered in conjunction with the accompanying drawings.

DESCRIPTION OF THE PREFERRED EMBODIMENTS

Figure 3:
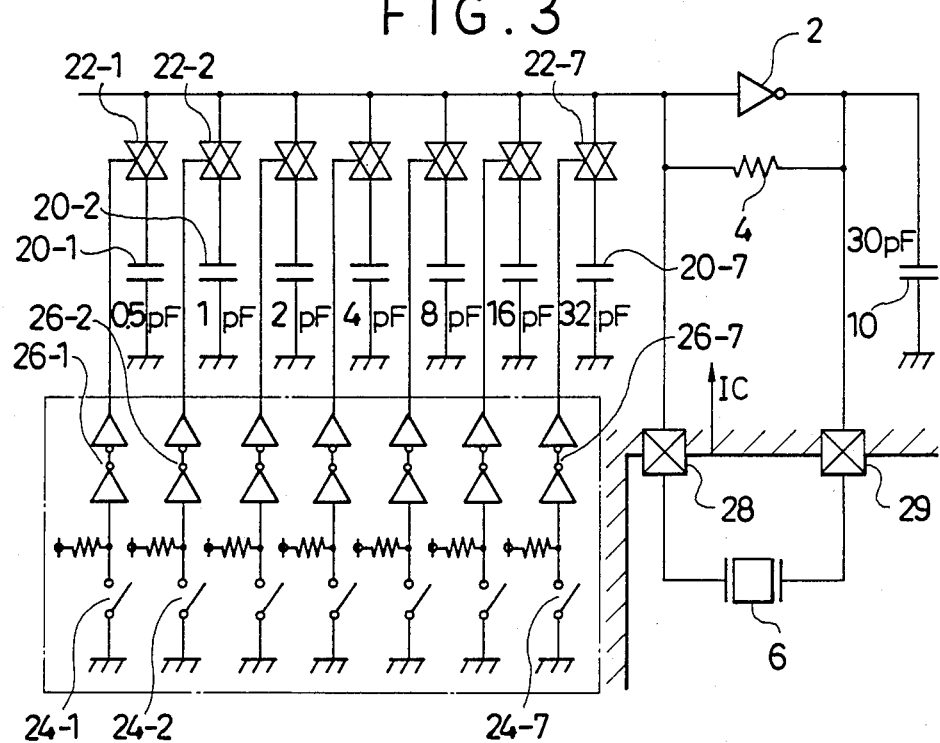
FIG. 3 is a schematic illustration showing an oscillating circuit constructed in accordance with one embodiment of the present invention using a plurality of capacitors and selecting means operatively coupled to the plurality of capacitors in place of an external trimmer capacitor.

Referring now to FIG. 3, there is schematically shown an ocsillating circuit for use in a clock I.C. constructed in accordance with one embodiment of the present invention. As shown, the oscillating circuit includes an inverter 2 and a resistor 4 which are internally provided and connected in parallel and between a pair of terminals 28 and 29. A quartz crystal oscillator 6 is externally provided and also connected between the pair of terminals 28 and 29. It is to be noted that, in the illustrated embodiment, all of the elements shown in FIG. 3 excepting the quartz crystal oscillator 6 are provided internally and thus on the same chip or substrate. A capacitor 10 having a fixed capacitance, i.e., 30 pF in the illustrated example, is also internally provided and one plate of the capacitor 10 is connected to ground and the other plate of the capacitor 10 is connected to the terminal 29. In addition, a plurality of capacitors 20-1 through 20-7 are also provided inside of the I.C., and, in the illustrated embodiment, these capacitors 20-1 through 20-7 have capacitances which are binary weighted. That is, in the illustrated embodiment, the capacitors 20-1 through 20-7 have capacitances 0.5 pF, 1 pF, 2pF, 4 pF, etc., respectively. Each of these capacitors 20-1 through 20-7 has its top plate connected to the terminal 28 through a corresponding one of a like plurality of analog switches 22-1 through 22-7 comprised in the form of transmission gates. And, the bottom plate of each of these capacitors 20-1 through 20-7 are commonly connected to ground. Thus, these capacitors 20-1 through 20-7 are connected in parallel between ground and the terminal 28 through respective analog switches 22-1 through 22-7.

Each of the analog switches 22-1 through 22-7 has its gate electrode connected to ground through a pair of serially connected inverters 26 and a corresponding programmable switch element 24. The programmable switch element 24 is, for example, comprised of an erasable transistor, such as a FAMOS or stacked gate MOS transistor, or a non-erasable element, such as a fuse or bipolar transistor. Also provided is a resistor connected between a power supply and the corresponding junction between the pair of inverters 26 and the programmable switch element 24.

With this structure, when the programmable switch elements 24-1 through 24-7 are selectively programmed to be turned on, those of the analog switches 22-1 through 22-7 which correspond to those of programmed switch elements 24 are turned on, and, thus, those of the capacitors 20-1 through 20-7 which correspond to those of the analog switches 22 which have been turned on are connected between ground and the terminal 28. In this manner, depending on which of the programmable switch elements 24-1 through 24-7 are programmed to be turned on, the corresponding capacitors 20 are selected for operation and connected to the terminal 28 and thus to the inverter 2 and resistor 4, thereby defining part of the oscillating circuit.

The inverter 2 is preferably comprised of a CMOS inverter. The capacitor array including the plurality of capacitors 20-1 through 207 is defined in the interior of the I.C. and each of the capacitors 20-1 through 20-7 is, for example, preferably comprised of a polysilicon layer, a diffusion layer and an electrically insulating layer sandwiched therebetween, or a polysilicon layer, a channel region and an electrically insulating layer sandwiched therebetween. Thus, these capacitors 20-1 through 20-7 may be fabricated with ease and at high accuracy. For a capacitor having a capacitance in the order of 100 pF, the required area is in the order of 300 microns×300 microns, and, thus, there arises no problem from a practical viewpoint. In the illustrated embodiment, since the capacitors 20-1 through 20-7 are constructed to have capacitance which are binary weighted, and, thus, the data for use in programming the programmable elements 24-1 through 24-7 may be in the form of a binary code. On the other hand, if desired, the capacitance of each of the capacitors 20-1 through 20-7 may be determined arbitrarily. In addition, although there are provided seven capacitors 20-1 through 20-7 in the illustrated embodiment, there may be provided as many capacitors as desired.

In the case where the programmable switch elements 24-1 through 24-7 have a sufficiently lower on-resistance and a sufficiently high off-resistance, then the analog switches 22-1 through 22-7 may be substituted with these programmable switch elements 24-1 through 24-7. In this case, the selective connection of the capacitors 20-1 through 20-7 to the inverter 2 and resistor 4 is directly controlled by a programming operation of these programmable switch elements 24-1 through 24-7.

In use, the user first connects the quartz crystal oscillator 6 across the terminals 28 and 29. Then, while measuring the oscillating frequency, the programmable switch elements 24-1 through 24-7 are selectively programmed in accordance with an error detected, thereby adjusting the oscillating frequency to a desired value. In such manner, adjustments are carried out electrically and digitally, so that no manual and mechanical process is required as different from the case when use is made of an external trimmer capacitor.

Figure 4:
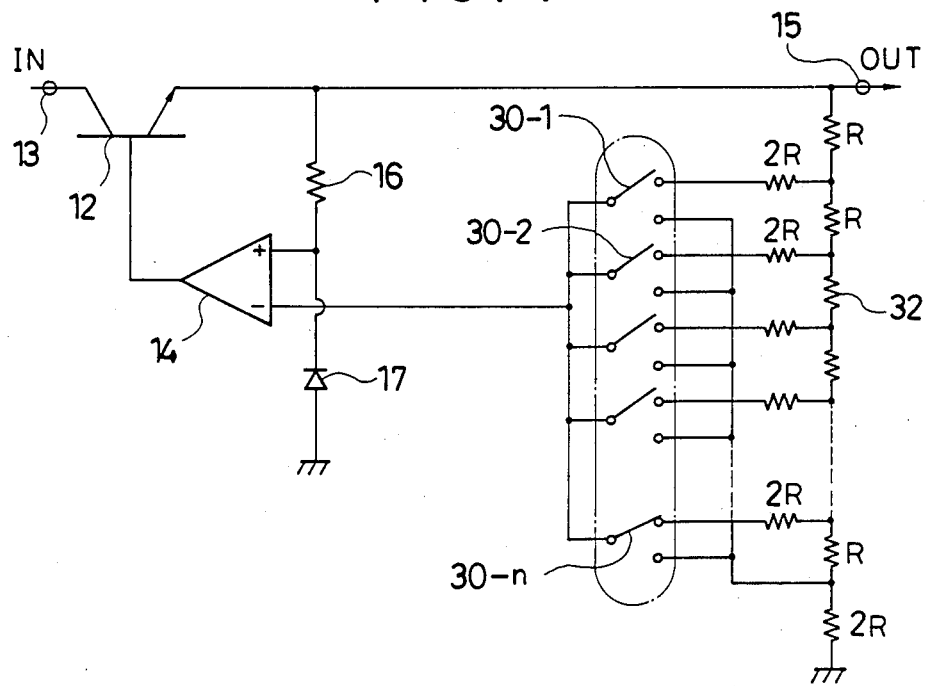
FIG. 4 is a schematic illustration showing a constant voltage source circuit constructed in accordance with another embodiment of the present invention using a plurality of resistors and selecting means operatively coupled to the plurality of resistors in place of an external variable resistor.

FIG. 4 shows an adjustable constant voltage power supply circuit constructed in accordance with another embodiment of the present invention. It is to be noted that all of the elements shown in FIG. 4 are fabricated on the same substrate, though this is not shown specifically. As shown, there is provided an NPN bipolar transistor 12 which has its collector connected to an input terminal 13, its emitter connected to an output terminal 15 and its base connected to an output terminal of a comparator 14 which is preferably comprised of an operational amplifier. The comparator 14 has an inverting input terminal which is connected to a moving contact of each of an n plurality of programmable switches 30-1 through 30-n. On the other hand, a resistor ladder 32 comprised of a (n+1) plurality of serially connected resistors is connected between the output terminal 15 and ground. Each of the programmable switches 30 may preferably be comprised of an erasable programmable element, such as a FAMOS or stacked gate MOS transistor, or a non-erasable programmable element, such as a fuse or bipolar transistor. And, each programmable switch 30 includes a pair of stationary contacts one of which is connected to the corresponding junction between two adjacent resistors of the resistor ladder 32 through a resistor having a fixed resistance of 2R and the other of which is commonly connected to the junction between the two adjacent resistors one of which is connected to ground. As described previously, the programmable switches 30-1 through 30-n, resistor ladder 32 and resistors connected between the resistor ladder 32 and the programmable switches 30 are all formed on the same chip on which the bipolar transistor 12 and the comparator 14 are formed.

Figure 1:
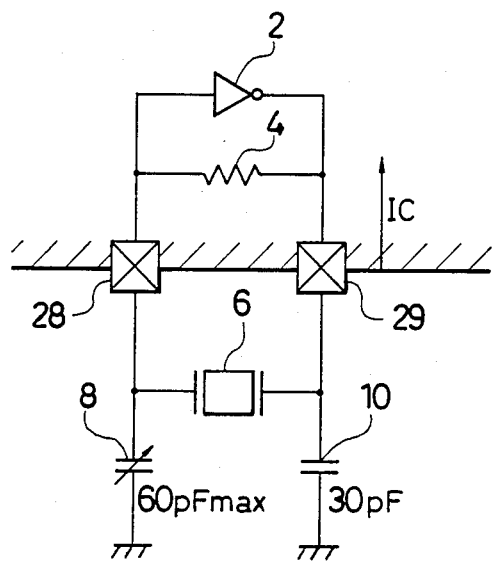
FIG. 1 is a schematic illustration showing a typical prior art oscillating circuit for use in a clock I.C. having an external trimmer capacitor as an adjustable element.
Figure 2:
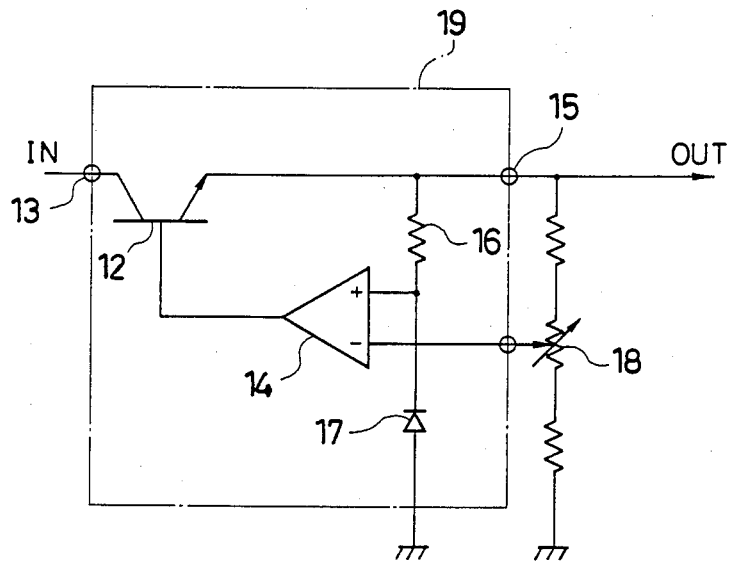
FIG. 2 is a schematic illustration showing a typical prior art constant voltage source circuit for use in a power supply I.C. having an external variable resistor as an adjustable element.

In the present embodiment, in order to obtain a desired output voltage at the output terminal 15 accurately, the programmable switches 30-1 through 30-n are selectively programmed, thereby causing the selected switches to establish connection to the stationary contact connected to the resistor having the resistance of 2R while keeping the non-selected switches connected to the stationary contact connected to ground through the lowermost resistor in the resistor ladder 32. With this structure, there is no need to carry out manual adjustments which are required for the prior art structure shown in FIG. 2, and adjustments can be carried out electrically and digitally by simply programming the programmable switches 30-1 through 30-n selectively.

As described above, in accordance with the principle of the present invention, the requirement for carrying out adjustments of an adjustable element, such as a trimmer capacitor or variable resistor, mechanically and manually has been obviated, and an adjustable structure is provided internally of an I.C. chip. Since the adjustable element can be fabricated at the same time on the same substrate when other components are fabricated, the present device can be manufactured at a reduced cost. In addition, in accordance with the teachings of the present invention, adjustments are carried out electrically and in a digital fashion, so that adjustments can be carried out rapidly as well as reliably.

While the above provides a full and complete disclosure of the preferred embodiments of the present invention, various modifications, alternate constructions and equivalents may be employed without departing from the true spirit and scope of the invention. Therefore, the above description and illustration should not be construed as limiting the scope of the invention, which is defined by the appended claims.

What is claimed is:

1. A semiconductor device comprising:
   a substrate having a circuit formed thereon;
   a plurality of capacitors formed on said substrate, each of said plurality of capacitors having a predetermined capacitance, said capacitors arranged in parallel in the form of an array and the capacitances of said capacitors being binary weighted;
   a plurality of first switches each of which is formed on said substrate and is connected in series between said circuit and a corresponding one of said plurality of capacitors; and
   a plurality of second switches each of which is formed on said substrate and is operatively coupled to a corresponding one of said plurality of first switches and can be in one of a first and a second state, wherein an on/off state of each of said plurality of first switches is controlled by the state of a corresponding one of said plurality of second switches.

2. The device of claim 1, wherein said first switches are analog switches.

3. The device of claim 1, wherein said second switches are programmable switches.

4. The device of claim 1, wherein said second switches are reprogrammable switches.

5. The device of claim 1 further comprising a first terminal and a second terminal provided on said substrate, wherein said circuit includes an inverter having its input connected to said first terminal and its output connected to said second terminal, a resistor connected in parallel with said inverter and an additional capacitor connected between said second terminal and a reference potential.

* * * * *